(12) United States Patent
Arvidsson et al.

(10) Patent No.: US 6,414,541 B1
(45) Date of Patent: Jul. 2, 2002

(54) SWITCHED CAPACITORS

(75) Inventors: Ragnar Arvidsson, Västra Frölunda; Mattias Duppils; Jan-Erik Eklund, both of Linköping, all of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/594,477

(22) Filed: Jun. 15, 2000

(30) Foreign Application Priority Data

Jun. 15, 1999 (SE) .............................................. 9902253

(51) Int. Cl.[7] .................................................. H03K 5/00
(52) U.S. Cl. ........................................ 327/554; 327/337
(58) Field of Search .......................... 327/94, 337, 554, 327/100; 330/9; 333/214

(56) References Cited

U.S. PATENT DOCUMENTS 4,364,116 A * 12/1982 Nossek ........................ 333/214
5,514,999 A * 5/1996 Koifman et al. ................ 330/9

* cited by examiner

Primary Examiner—Dinh T. Le
(74) Attorney, Agent, or Firm—Burns, Doane, Swecker & Mathis, L.L.P.

(57) ABSTRACT

A switched-capacitor circuit includes a plurality of sequentially-operated switched-capacitors A first capacitor is arranged to be coupled and thereafter uncoupled to an input signal during a first time period. Thereby the first capacitor is charged to an input value in dependence on the input signal. A second capacitor is arranged to be coupled and thereafter uncoupled to the first capacitor during a second time period for charge distribution between the second and first capacitor. Pairwise charge distribution is possibly done with further sequentially-operated switched capacitors. A final capacitor is arranged to be coupled and thereafter uncoupled to a previous capacitor during the final time period for charge distribution between the final and the previous capacitor. The switched-capacitor circuit further includes selectively coupling the first and the second sequentially-operated switched-capacitors to an output circuit thereby enabling a desired weighting of the input signal to be attained.

25 Claims, 3 Drawing Sheets

SWITCHED CAPACITORS

TECHNICAL FIELD

The invention concerns switched capacitor technology, specifically variable value switched capacitor circuits and switched capacitor filters, such as finite impulse response filters (FIR-filter), with variable value switched capacitor circuits.

BACKGROUND

Switched capacitor circuits are used for their suitability to be placed on a single semiconductor chip thereby replacing filters that have been conventionally constructed using discrete resistors, capacitors and inductors. In switched capacitor circuits, resistors and inductors are replaced by switches and capacitors.

Finite impulse response filters (FIR-filters) can be expressed as a series, for example such as $$y(k) = \sum_{n=0}^{k} g(n) * x(n),$$

where g(n) is the n:th weight factor/coefficient for the n:th input value x(n). Expanded it will end up to be y(k)=g(0)*x(0)+g(1)*x(1)+g(2)*x(2)+. . . +g(k−1)*x(k−1)+g(k)*x(k). The series needs k+1, possibly different, weights/coefficients if it has k terms and an initial value. An implementation of such an equation would not be practical. If a simple and flexible solution to this is desired then an implementation of the recursive equation y(k)=y(k−1)+g(k)*x(k) is preferably made. However, an implementation according to the recursive equation requires dynamically adjustable coefficients. In an implementation utilizing switched capacitor technology the value of the coefficient can be varied by, for example, dividing the sampling capacitor into a suitable number of equal sized part-capacitors, for example 256 part-capacitors. The number of part-capacitors used will depend on the desired resolution of the coefficient, a 12 bit resolution coefficient, for example, needs 4096 capacitors. During each sampling all of the sampling capacitors are charged to the input signal value. Thereafter, the input is disconnected and a number of the capacitors representing the desired filter coefficient, are connected to an output circuit, in this case an integrator. An example of such a circuit is described in the U.S. Pat. No. 5,220,286. This method of obtaining a variable coefficient circuit can suitably be named the capacitance division method. A disadvantage can be considered to be the large number of capacitances and corresponding switches that are necessary if a high resolution is desired.

SUMMARY

An object of the invention is to define a variable value switched capacitor circuit requiring a drastically reduced number of capacitors and switches in relation to a circuit according to the capacitance division method.

Another object of the invention is to define a method of controlling a switched capacitor circuit to thereby obtain a variable value switched capacitor with a drastically reduced number of capacitors and switches in relation to a circuit according to the capacitance division method.

The aforementioned objects are achieved according to the invention by a switched-capacitor circuit comprising a plurality of sequentially-operated switched-capacitors. A first capacitor is arranged to be coupled and thereafter uncoupled to an input signal during a first time period. Thereby the first capacitor is charged to an input value in dependence on the input signal. A second capacitor is arranged to be coupled and thereafter uncoupled to the first capacitor during a second time period for charge distribution between the second and the first capacitor. Pairwise charge distribution is possibly done with further sequentially-operated switched capacitors. A final capacitor is arranged to be coupled and thereafter uncoupled to a previous capacitor during the final time period for charge distribution between the final and the previous capacitor. The switched-capacitor circuit further comprises means for selectively coupling the first and the second sequentially-operated switched-capacitors to an output circuit thereby enabling a desired weighting of the input signal to be attained.

The aforementioned objects are also achieved according to the invention by a switched-capacitor circuit comprising a plurality of sequentially-operated switched-capacitors. The capacitors are sequentially switched during a plurality of time periods. The circuit comprises at least a first, a second and a final sequentially-operated switched-capacitor. The first switched-capacitor is arranged to be coupled and thereafter uncoupled to an input signal during a first time period. The first switched-capacitor is thus charged to an input value in dependence on the input signal. The second switched-capacitor is arranged to be coupled and thereafter uncoupled to the first switched-capacitor during a second time period for charge distribution between the second and the first switched-capacitor. The charge is thus divided between the first and the second switched-capacitor. The second switched-capacitor becoming a previous switched-capacitor during the time period following the time period the second switched-capacitor received charge. The final switched-capacitor is arranged to be coupled and thereafter uncoupled to the previous switched-capacitor, in the minimum case this is the second switched-capacitor, during the final time period for charge distribution between the final and the previous switched-capacitor. The charge is thus divided between the final and the previous switched-capacitor. The switched-capacitor circuit further comprises means for selectively coupling the first and the second switched-capacitors to an output circuit thereby enabling a desired weighting of the input signal to be attained.

Advantageously, to achieve a higher weight factor resolution, the circuit further comprises a predetermined number of additional sequentially-operated switched-capacitors. The additional capacitors are arranged between the second switched-capacitor and the final switched-capacitor. Each additional sequentially-operated switched-capacitor is arranged to be coupled and thereafter uncoupled to a previous switched-capacitor during a time period for charge distribution between an additional switched-capacitor in question and the previous switched-capacitor. The charge is thus divided between the additional switched-capacitor in question and the previous switched-capacitor. The additional switched-capacitor in question becoming the previous switched-capacitor during the time period following the time period the additonal switched-capacitor in question received charge. The switched-capacitor circuit further comprises means for selectively coupling each additional sequentially-operated switched-capacitor to an output circuit.

Some embodiments of the switched capacitor circuit further comprises a first parallel-operated capacitor. The first parallel-operated capacitor is arranged to be coupled and thereafter be uncoupled to the input signal during the first time period. The first parallel-operated capacitor is not involved in any charge sharing with the sequentially-operated switched-capacitors. The circuit further comprises means for selectively coupling the first parallel-operated capacitor to an output circuit.

Advantageously each means for selectively coupling a sequentially-operated capacitor to an output circuit is for each capacitor in question selectively activated during a time period which is after a time period when the capacitor in question distributed its charge to a further capacitor.

Preferably each capacitor which is not coupled directly to the input signal is shorted at the latest during a time period before a time period in which a capacitor in question receives a charge distribution from a previous capacitor.

In certain embodiments the circuit is doubled into two identical branches, the operation of the branches being time shifted in relation to each other, thereby doubling the throughput rate. In some version the circuit is quadrupled into four identical branches, the operation of the branches being time shifted in relation to each other, thereby quadrupling the throughput rate. In some versions the circuit is arranged to be coupled to one output for every four sequentially-operated switched-capacitors that can be selectively coupled to an output circuit.

Preferably all the capacitors all have the same capacitance thereby enabling a selectable linear binary weighting of the input signal.

Advantageously the circuit comprises further more parallel-operated input capacitors. The circuit also further advantageously comprises more parallel-operated least significant bit switched-capacitors. In some embodiments the final switched-capacitor consists of a plurality of parallel-operated least significant bit switched-capacitors.

To enable weighted summations some embodiments of the circuit further comprises output means in the form of an integrator, thereby providing a computing-element for weighted summations. The circuit is in some embodiments a filter which filters the input signal. The circuit can then for example be a finite impulse response filter working according to a series development. The circuit can also comprise two output circuits, one output giving a quadrature value and the other output giving an in-phase value.

Preferably the circuit is completely differential to thereby handle both positive and negative weight factors. Other important advantages with these embodiments of the invention is that the circuit will be immune to supply noise and achieve a high common mode rejection ratio. In some embodiments the circuit comprises a reversing switch to reverse a polarity of the input signal to thereby enable both positive and negative weight factors.

The different additional enhancements of the invention can be combined in any desired manner as long as not any conflicting features are combined. The aforementioned objects are also achieved according to the invention by a switched-capacitor circuit which comprises a plurality of sequentially-operated switched-capacitors. The first of which is coupled to an input signal during a first time period thereby charging the first switched-capacitor to an input value in dependence on the input signal. Thereafter the charge on the first switched capacitor is sequentially charge distributed during further time periods. Each sequential charge distribution is between pairs of sequentially-operated switched-capacitors. First the charge is divided between a first pair of sequentially-operated switched capacitors consisting of the first sequentially-operated switched-capacitor and a second sequentially-operated switched-capacitor. Then during a next time period the charge is divided between a second pair of sequentially-operated switched-capacitors consisting of the second sequentially-operated switched-capacitor and a third sequentially-operated switched-capacitor. This is repeated between pairs of sequentially-operated switched-capacitors until a last sequentially-operated switched-capacitor belongs to a pair of switched-capacitors performing charge division. The switched-capacitor circuit further comprises means for selectively coupling the switched-capacitors to an output circuit thereby enabling a desired weighting of the input signal to be attained.

The aforementioned objects are also achieved according to the invention by a switched-capacitor circuit comprising a plurality of sequentially-operated switched-capacitors. An input sequentially-operated switched-capacitor is arranged to be coupled and thereafter uncoupled to an input signal during a first time period. The input switched-capacitor is thus charged to an input value in dependence on the input signal. For a following time period the input switched-capacitor becomes a previously charged switched-capacitor. A predetermined number of further sequentially-operated switched-capacitors are arranged to sequentially perform a number of steps. Of which further sequentially-operated switched-capacitors, a discharged current switched-capacitor is arranged to be coupled and thereafter uncoupled to the previously charged switched-capacitor during a time period for charge distribution between the current and the previously charged switched-capacitor. The charge is thus divided between them. Thereafter the current switched-capacitor becomes the previously charged switched-capacitor and the process-steps are repeated until all further sequentially-operated switched-capacitors have become the previously charged switched-capacitor. A final switched-capacitor is arranged to be coupled and thereafter uncoupled to the previously charged switched-capacitor during the final time period for charge distribution between the final and the previously charged switched-capacitor. The charge is thus divided between the final and the previously charged switched-capacitor. Then by further coupling by coupling means selected switched-capacitors to an output circuit a desired weighting of the input signal can be attained.

The aforementioned objects are also achieved according to the invention by a method of weighting an input signal by means of a switched-capacitor circuit comprising a plurality of switched-capacitors. According to the method the switched capacitors are sequentially switched during a plurality of time periods. The method comprises a number of steps. In a first step a first switched-capacitor is charged to an input value in dependence on the input signal by coupling and thereafter uncoupling the first switched-capacitor to an input signal during a first time period. Thereafter in a second step the charge on the first switched-capacitor is divided between the first switched-capacitor and a second switched-capacitor by coupling and thereafter uncoupling the second switched-capacitor to the first switched-capacitor during a second time period for enabling charge distribution between the second and the first switched-capacitor, the second switched-capacitor becoming a previous switched-capacitor during the third time period. Thereafter in a final charge division step the charge on the previous switched capacitor is divided between the previous switched-capacitor and a final switched-capacitor by coupling and thereafter uncoupling the final switched capacitor to the previous switched-capacitor during a final time period for enabling charge distribution between the final and the previous switched-capacitor. The first switched-capacitor and the second switched-capacitor are also selectively coupled to an output circuit to thereby enable a desired weighting of the input signal to be attained.

Advantageously to further extend the resolution of the weigthing factor the method further comprises a predetermined number of addional steps. The additional steps are preferably performed between the second time period and the final time period and performed on one or more additional switched-capacitors. The additional steps comprises a step that is performed repeatedly on one additonal switched capacitor at a time. The step comprises dividing the charge on the previous switched-capacitor between the previous switched-capacitor and an additional switched-capacitor in question by coupling and thereafter uncoupling the additional switched-capacitor in question to the previous capacitor during a time period for charge distribution between the additional switched-capacitor in question and the previous switched-capacitor. The additional switched-capacitor in question thereafter becomes the previous switched-capacitor for a time period directly following the time period for charge distribution between the additional switched-capacitor in question and the previous switched-capacitor. The method also comprises the additional step or steps of selectively coupling each additional switched-capacitor to the output circuit.

In some versions of the method each step of selectively coupling a switched-capacitor to an output circuit is for each switched-capacitor in question selectively activated during a time period which is after a time period when the switched-capacitor in question distributed its charge to a further capacitor.

In other versions the method further comprises the step of coupling and thereafter uncoupling a first parallel-operated switched-capacitor to the input signal during the first time period, and selectively coupling the first parallel-operated capacitor to an output circuit.

In still other versions for each switched-capacitor which is not coupled directly to the input signal the method comprises the step of shorting a switched-capacitor in question at the latest during a time period before a time period in which the switched-capacitor in question receives a charge distribution from a previous capacitor.

The different additional enhancements of the method according to the invention can be combined in any desired manner as long as not any conflicting enhancements are combined.

By providing a variable value switched-capacitor circuit a plurality of advantages over prior art systems are obtained. A primary purpose of the invention is to reduce the number of capacitors and switches needed for a specific resolution. For a 12 bit binary coefficient/weight factor, in a basic embodiment of the invention with charge sharing, 13 equal sized capacitors and approximately 40 switches are needed. These numbers should be compared with the 4096 equal sized capacitors and more than 8000 switches that are needed with the capacitance division method. According to the invention this reduction is achieved primarily by sequential charge sharing between pairs of capacitors. The use of a low number of a equal sized capacitors enables a higher accuracy to be achieved as it is easier to manufacture a limited number of equal sized capacitors than manufacturing a large number of equal sized capacitors or a scale of different sized capacitors. Speed improvements are easily attained by adding parallel processing paths.

Other advantages of this invention will become apparent from the detailed description.

BRIEF DESCRIPTION OF THE DRAWINGS

The invention will now be described in more detail for explanatory, and in no sense limiting, purposes, with reference to the following figures, in which.

DETAILED DESCRIPTION

Figure 1:
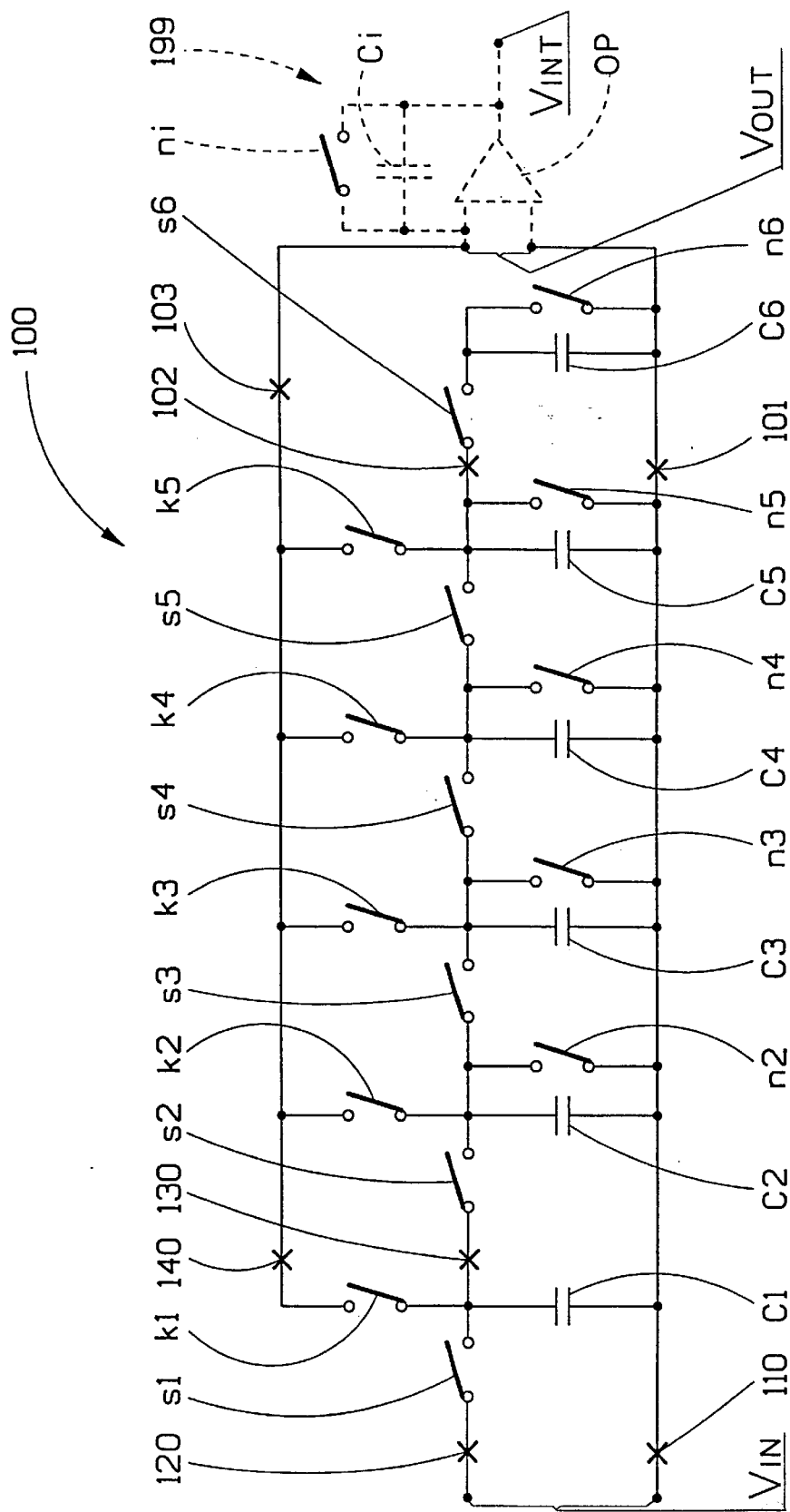
FIG. 1 shows a switched capacitor circuit according to the invention and an example of its use with an output circuit.

In order to clarify the method and device according to the invention, some examples of its use will now be described in connection with FIGS. 1 to 3.

The basic principle of the invention is to sequentially divide an initial charge between pairs of capacitors. By this division of charge an arbitrary desired coefficient/weight factor can be realised by connecting one or more of the charged capacitors to an output circuit (unless the coefficient is zero, then no capacitor is connected to the output circuit). The method according to the invention will be called the charge sharing method. FIG. 1 shows a switched capacitor circuit 100 according to the invention and an example of its use with an output circuit 199. In the embodiment according to this example of the invention there are six charge sharing capacitors C1, C2, C3, C4, C5, C6, all of which have an associated signal switch s1, s2, s3, s4, s5, s6 for connection of the corresponding capacitor to a charge source, for example a previously charged capacitor, to thereby enable charge sharing. The switches of the switched capacitor circuit can, for example, be MOS transistors. At least all but the first capacitor C1 have an associated reset/nullification/discharge switch n2, n3, n4, n5, n6 which short circuits, i.e. discharges/nullifies/resets, the corresponding capacitor C2, C3, C4, C5, C6 at the latest during the time period before a capacitor in question is charged during a charge sharing. Normally the first capacitor C1 does not need to be discharged before it is connected to an input voltage $V_{IN}$, unless, for example, there is no active source driver feeding the switched capacitor circuit. All but the last capacitor C6 have an associated part-coefficient switch k1, k2, k3, k4, k5 for connection of the corresponding capacitor C1, C2, C3, C4, C5 to an output $V_{OUT}$, which is suitably connected to an output circuit, for example like the output circuit 199 in the figure. The output circuit 199 in the figure is an integrator comprising an op-amp OP, an integration capacitor $C_i$; with an associated nullification/discharge switch $n_i$ for discharging the integration capacitor $C_i$. An integrator 199 is suitable to use as an output circuit when the switched capacitor circuit 100 is used for, for example, realizing a series development.

An input voltage $V_{IN}$ is connected to the first capacitor C1 through the first signal switch s1 for charging the first capacitor C1 to $V_{IN}$ during a first time period. Also during the first time period the second capacitor C2 is, at the latest, discharged by means of the associated discharge switch n2. The signal switch s1 and discharge switch n2 are thus switched from open to closed at the beginning of the first time period, kept closed during the first time period and then opened again at the end of the first time period. During a second time period the charge is shared between the first capacitor C1 and the second capacitor C2 by means of signal switch s2. The charge is distributed between the two capacitors C1, C2 in dependence of their relative capacitance. The relative capacitances of the capacitors C1, C2, C3, C4, C5, C6 will determine what part-coefficient/weight factor each part-coefficient switch k1, k2, k3, k4, k5 will represent. In a preferred embodiment of the invention, the charge sharing capacitors C1, C2, C3, C4, C5, C6 of the switched capacitor circuit according to the invention, all have the same capacitance. Each charge sharing will then half the charge and thus also half the voltage which the source capacitor had before the sharing. This will result in linear binary coefficients where the first part-coefficient switch k1 will represent a value of 0.5, the second part-coefficient switch k2 will represent a value of 0.25, the third part-coefficient k3 will represent a value of 0.125, and so on as seen in the basic control table below.

Additionally during the second time period, the third capacitor C3 is discharged by means of its associated discharge switch n3. The signal switch s2 and discharge switch n3 are thus switched from open to closed at the beginning of the second time period, kept closed during the second time period and then opened again at the end of the second time period. Thus, between the second time period and the third time period the first capacitor C1 has shared its charge with the second capacitor C2 and the third capacitor C3 has been discharged to enable a charge sharing with the second capacitor C2 during a third time period. During the third time period the second capacitor C2 shares its charge with the third capacitor C3, and the fourth capacitor C4 is discharged by means of its associated discharge switch n4. The signal switch s3 and discharge switch n4 are thus switched from open to closed at the beginning of the third time period, kept closed during the third time period and then opened again at the end of the third time period. Additionally, when, for example, an output circuit comprises an accumulator/adder, such as the output circuit 199 shown in the figure, the part-coefficients can be added sequentially to an output circuit. Thus in this example, during the third time period, the part-coefficient switch k1 associated with the first capacitor C1 can, in dependence of the desired total weight factor/coefficient, be used for a charge/voltage transfer of the charge/voltage on C1 to the output $V_{OUT}$ and output circuit 199 by switching part-coefficient switch k1 from open to closed at the beginning of the third time period, kept closed during the third time period and then opened again at the end of the third time period.

The procedure is repeated during the following time periods for the remainder of capacitors C4, C5, C6, the only divergence to the procedure being that the last capacitor C6 does not have a part-coefficient switch in this embodiment and can thus not transfer its charge/voltage to the output $V_{OUT}$. If all of the capacitors C1, C2, C3, C4, C5, C6 have the same capacitance, then the last capacitor C6 and the second to last capacitor C5 will have the same charge/voltage, a part-coefficient switch for C6 is thus unnecessary.

If the switched capacitor circuit 100 is used in the computation of, for example, a series expansion where several weigthed samples are accumulated/integrated, then a certain degree of overlap can exist between consecutive samples, i.e. in dependence on the length of the switched capacitor circuit two or more different samples are being processed by the switched capacitor circuit at the same time, the samples are pipelined. As high a degree of overlap as possible should always be aspired to be attained. This is made possible by the early transfer of charge, if it should be done, from a capacitor that is not used for any more charge sharing, to an output circuit via the capacitor's corresponding part-coefficient switch to thereby free the capacitor in question for the next sample.

A complete basic control table of the switches is shown below where all of the empty boxes for the switches denote that the switch in question is open, i.e. non-conducting, a "c" denotes closed, i.e. conducting, and c/o denotes that the switch is either closed or open. For the capacitors only the capacitor voltages which have any influence are shown, where $V_1$ is the first sample and $V_2$ is the second sample.

Basic Control Table

| | | | | | Time Period | | | | | | |
|---|---|---|---|---|---|---|---|---|---|---|---|
| | 1 | 2 | 3 | 4 | 5 | 6 | 7 | 8 | 9 | 10 | 11 |
| Reset switch | | | | | | | | | | | |
| n2 | c | | | | | c | | | | | |
| n3 | | c | | | | | c | | | | |
| n4 | | | c | | | | c | | | | |
| n5 | | | | c | | | | c | | | |
| n6 | | | | | c | | | | c | | |
| Signal switch | | | | | | | | | | | |
| s1 | c | | | | | c | | | | | |
| s2 | | c | | | | | c | | | | |
| s3 | | | c | | | | c | | | | |
| s4 | | | | c | | | | c | | | |
| s5 | | | | | c | | | | c | | |
| s6 | | | | | | c | | | | c | |
| Part-Coefficient switch | | | | | | | | | | | |
| k1 | | | c/o | | | | c/o | | | | |
| k2 | | | | c/o | | | | c/o | | | |
| k3 | | | | | c/o | | | | c/o | | |
| k4 | | | | | | c/o | | | | c/o | |
| k5 | | | | | | | c/o | | | | c/o |
| Capacitor voltage | | | | | | | | | | | |
| C1 | $V_1$ | $V_1/2$ | $V_1/2$ | | | $V_2$ | $V_2/2$ | $V_2/2$ | | | |
| C2 | 0 | $V_1/2$ | $V_1/4$ | $V_1/4$ | 0 | $V_2/2$ | $V_2/4$ | $V_2/4$ | | | |

-continued

Basic Control Table

| | \multicolumn{11}{c|}{Time Period} |
|---|---|---|---|---|---|---|---|---|---|---|---|
| | 1 | 2 | 3 | 4 | 5 | 6 | 7 | 8 | 9 | 10 | 11 |
| C3 | 0 | $V_1/4$ | $V_1/8$ | $V_1/8$ | 0 | $V_2/4$ | | $V_2/8$ | $V_2/8$ | | |
| C4 | | 0 | $V_1/8$ | $V_1/16$ | $V_1/16$ | 0 | | $V_2/8$ | $V_2/16$ | $V_2/16$ | |
| C5 | | | 0 | $V_1/16$ | $V_1/32$ | $V_1/32$ | 0 | | $V_2/16$ | $V_2/32$ | $V_2/32$ |
| C6 | | | | 0 | $V_1/32$ | | | | 0 | $V_2/32$ | |

After the last sample, in for example a series expansion calculation, the pipeline must be emptied, the final weighted sample added in the output circuit 199 and fed to another circuit. The output circuit must be cleared/made ready for the next calculation of, for example a series expansion, by, for example, discharging the integration capacitor Ci by discharge switch ni, before a new sample, i.e. the first sample of the next calculation, is in any part fed to the output $V_{OUT}$. According to an enhancement of the invention this can be avoided by providing multiple output circuits, one for every start of a multiple of four part-coefficients, the example above should therefore have two output circuits in such an embodiment. In some applications/embodiments of the invention there is no accumulation in an output circuit and then there can be no overlap, all the part-coefficient switches have to switch during the same time period for transfer of charges/voltages to an output circuit. A no accumulation/overlap control table to the switched capacitor circuit 100 is shown below where all of the empty boxes for the switches denote that the switch in question is open, i.e. non-conducting, a "c" denotes closed, i.e. conducting, and c/o denotes that the switch is either closed or open. For the capacitors only the capacitor voltages which have any influence are shown, where $V_1$ is the first sample and $V_2$ is the second sample.

No accumulator/overlap Control Table

| | \multicolumn{11}{c|}{Time Period} |
|---|---|---|---|---|---|---|---|---|---|---|---|
| | 1 | 2 | 3 | 4 | 5 | 6 | 7 | 8 | 9 | 10 | 11 |
| Reset switch | | | | | | | | | | | |
| n2 | c | | | | | | | c | | | |
| n3 | | c | | | | | | | c | | |
| n4 | | | c | | | | | | | c | |
| n5 | | | | c | | | | | | | c |
| n6 | | | | | c | | | | | | |
| Signal switch | | | | | | | | | | | |
| s1 | c | | | | | | | c | | | |
| s2 | | c | | | | | | | c | | |
| s3 | | | c | | | | | | | c | |
| s4 | | | | c | | | | | | | c |
| s5 | | | | | c | | | | | | |
| s6 | | | | | | c | | | | | |
| Part-Coefficient switch | | | | | | | | | | | |
| k1 | | | | | | | c/o | | | | |
| k2 | | | | | | | c/o | | | | |
| k3 | | | | | | | c/o | | | | |
| k4 | | | | | | | c/o | | | | |
| k5 | | | | | | | c/o | | | | |
| Capacitor voltage | | | | | | | | | | | |
| C1 | $V_1$ | $V_1/2$ | $V_1/2$ | $V_1/2$ | $V_1/2$ | $V_1/2$ | $V_1/2$ | $V_2$ | $V_2/2$ | $V_2/2$ | $V_2/2$ |
| C2 | 0 | $V_1/2$ | $V_1/4$ | $V_1/4$ | $V_1/4$ | $V_1/4$ | $V_1/4$ | 0 | $V_2/2$ | $V_2/4$ | $V_2/4$ |
| C3 | | 0 | $V_1/4$ | $V_1/8$ | $V_1/8$ | $V_1/8$ | $V_1/8$ | | 0 | $V_2/4$ | $V_2/8$ |
| C4 | | | 0 | $V_1/8$ | $V_1/16$ | $V_1/16$ | $V_1/16$ | | | 0 | $V_2/8$ |
| C5 | | | | 0 | $V_1/16$ | $V_1/32$ | $V_1/32$ | | | | 0 |
| C6 | | | | | 0 | $V_1/32$ | | | | | |

With a switched capacitor circuit 100 according to FIG. 1 a sampled signal value can be divided into a number of values that form a linear binary series if the capacitors are of equal capacitance. This first basic example of the invention has a 5 bit coefficient/weight factor resolution which can be increased or decreased. After four time periods a new sample of the input signal can be taken if overlap is possible. If a higher sampling rate is desired without increasing the clock rate then several switched capacitor circuits can be coupled to work in parallel. By using four parallel time multiplexed branches the sampling rate corresponds to the switching rate of the switched capacitor circuit 100. Sever al output circuits can also be used to enable a more efficient pipelining/overlap and/or to directly generate a quadrature and an inphase output.

An enhancement of the invention is to add an optional capacitor that is coupled to the input signal during the same time periods that the first capacitor C1 is coupled to the input signal. Both C1 and the optional capacitor will then have the whole signal value stored. The first charge sharing is then performed, as previously described, between the first capacitor C1 and the second capacitor C2 during the second time period. The optional capacitor is not used for charge sharing and an optional part-coefficient switch associated with the optional capacitor can then during the second time period, in dependence on the desired weight factor, transfer its charge/voltage to the output $V_{OUT}$. The optional capacitor does not normally need a discharge switch. The most significant bit part-coefficient, from the optional capacitor, will become 1 and thereby increase the signal to noise ratio as more charge is conserved.

Figure 2:
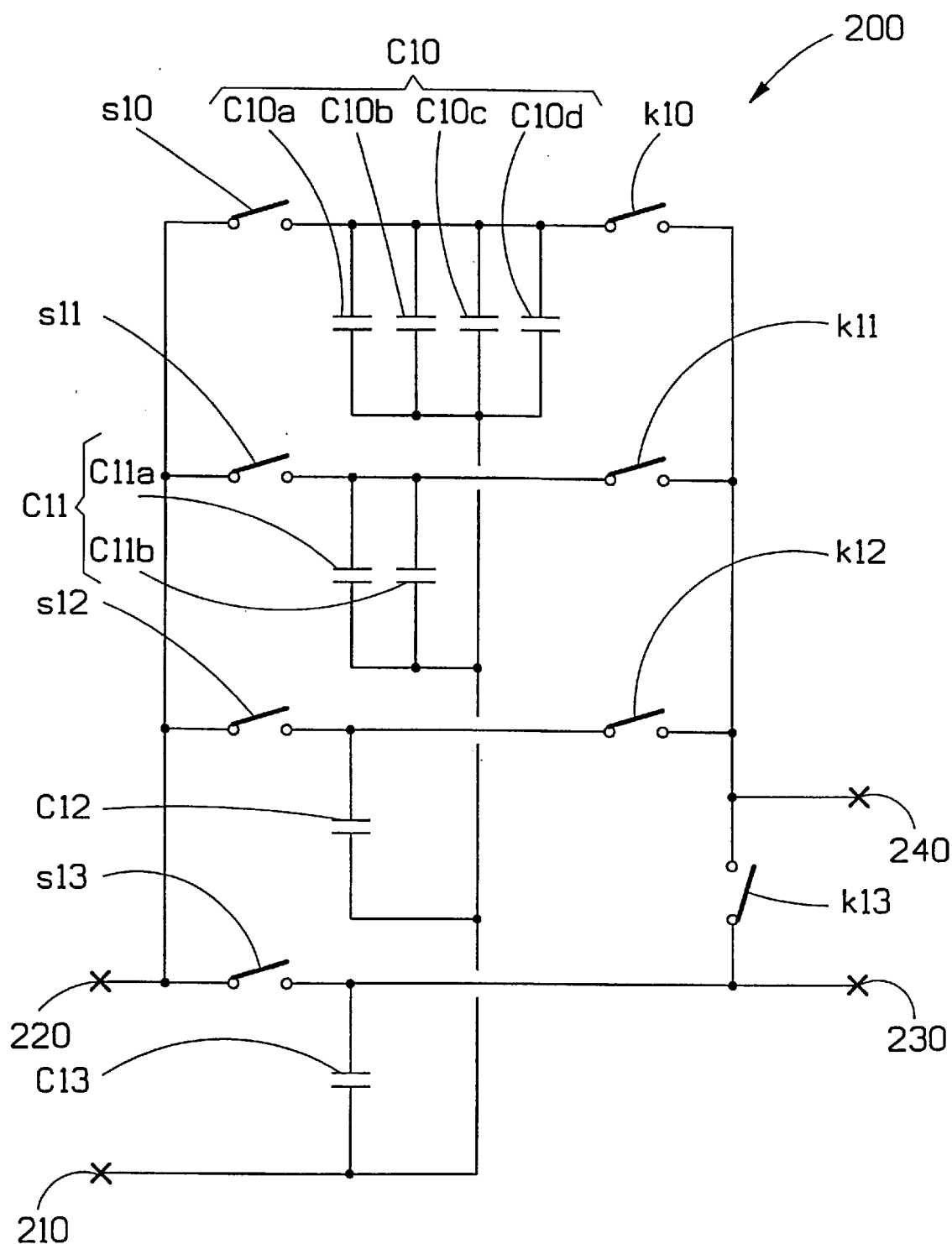
FIG. 2 shows a most significant bit or bits expansion.

FIG. 2 shows a most significant bit or bits expansion (MSB-expansion) 200. The MSB-expansion is meant to replace the most significant bit capacitor and associated switches of a variable switched capacitor circuit. To facilitate the understanding of the MSB-expansion 200 the replacement is done in relation to FIG. 1. The MSB-expansion 200 is not restricted to be used with a switched capacitor circuit according to FIG. 1. The MSB-expansion replaces the most significant bit (MSB) capacitor and associated switches, in this case capacitor C1 and switches s1 and k1 of FIG. 1. The connection points 210, 220, 230, 240 of the MSB-expansion 200 of FIG. 2 are connected to the respective connection points 110, 120, 130, 140 of FIG. 1.

The MSB-expansion 200 of FIG. 2 demonstrates an expansion of three most significant bits. The MSB-expansion 200 comprises four capacitors C10 (comprising four part-capacitors C10a, C10b, C10c, C10d in the figure), C11 (comprising two part-capacitors C11a, C11b in the figure), C12, and C13. Each capacitor C10, C11, C12, C13 has its own corresponding signal switch s10, s11, s12, s13 and its own corresponding part-coefficient switch k10, k11, k12, k13. As previously discussed, according to preferred emodiments of the invention, all, or most, of the capacitors should have the same value. In normalized values and with binary linear coefficients, C10 should be 4 units, i.e. 4 units of a factor of a Farad, C11 should be 2 units and C12 and C13 should be 1 unit each. This means that C10 can be made with four 1 unit capacitors C10a, C10b, C10c, C10d, and C11 can be made with two 1 unit capacitors C11a, C11b, as is shown in FIG. 2. As is explained above, the capacitance relationship between the capacitors can be different if another coefficient type is desired, such as logarithmic. Depending on the situation, another standard size capacitor can of course be used, for example 0.5 unit capacitors, this would result in C10 being made of eight 0.5 unit capacitors, C11 being made of four 0.5 unit capacitors, and C12 and C13 each being made of two 0.5 unit capacitors. The number of capacitors that make up each capacitor of FIG. 1 would also change accordingly.

The MSB-expansion 200 of FIG. 2 gives, assuming linear binary part-coefficients, a part-coefficient value of 4 for part-coefficient switch k10 for capacitor C10, a part-coefficient value of 2 for part-coefficient switch k11 for capacitor C11, a part-coefficient value of 1 for part-coefficient switch k12 for capacitor C12, and a part-coefficient value of ½ for part-coefficient switch k13 for capacitor C13 corresponding to part-coefficient switch k1 of FIG. 1. This enhanced verison of the invention results in an even larger dynamic range and thus also higher signal to noise ratio.

During a first time period of this enhanced switched capacitor circuit, the four capacitors C10, C11, C12, C13 are connected to the input signal $V_{IN}$ via their corresponding signal switches s10, s11, s12, s13 to thereby fully charge these parallel coupled capacitors C10, C11, C12, C13. Additionally during the first time period, capacitor C2 of FIG. 1 is discharged. The signal switches s10, s11, s12, s13 and discharge switch n2 are thus switched from open to closed at the beginning of the first time period, kept closed during the first time period and then opened again at the end of the first time period. During a second time period the part-coefficient switches k10, k11, k12 corresponding to the three most significant bits/capacitors C10, C11, C12 can be connected to the output $V_{OUT}$ and an output circuit, in dependence on the desired weight factor and if an overlap is possible and the output circuit allows it, see above. Additionally during the second time period the charge on capacitor C13 is shared with capacitor C2 of FIG. 1, while capacitor C3 of FIG. 1 is discharged. The signal switch s2, discharge switch n3, and possibly one or more of the part-coefficient switches k10, k11, k12 are thus switched from open to closed at the beginning of the second time period, kept closed during the second time period and then opened again at the end of the second time period. The operation of this enhanced version is actually identical to the operation of the basic version according to FIG. 1 with capacitor C13 and associated switches s13, k13 working identical to capacitor C1 and associated switches s1, k1 of figure one and excluding the addition of the operation of the three most significant bit capacitors C10, C11, C12 and their corresponding switches s10, s11, s12, k11, k12, k13 during the first two time periods (if possible).

The control of the switches can be seen in the enhanced control table below. For the MSB-expansion 200 the first three time periods are the most relevant time periods. The enhanced control table also include control of a least significant bit or bits expansion (LSB-expansion) which is discussed below in relation to FIG. 3. The MSB-expansion 200 can use more capacitors for added MSB part-coefficients or use less capacitors for fewer MSB part-coefficients than shown. For example, using only capacitor C12 and capacitor C13 with associated switches s12, s13, k12, k13 is a visualization of the above described most significant expansion with an optional capacitor.

Figure 3:
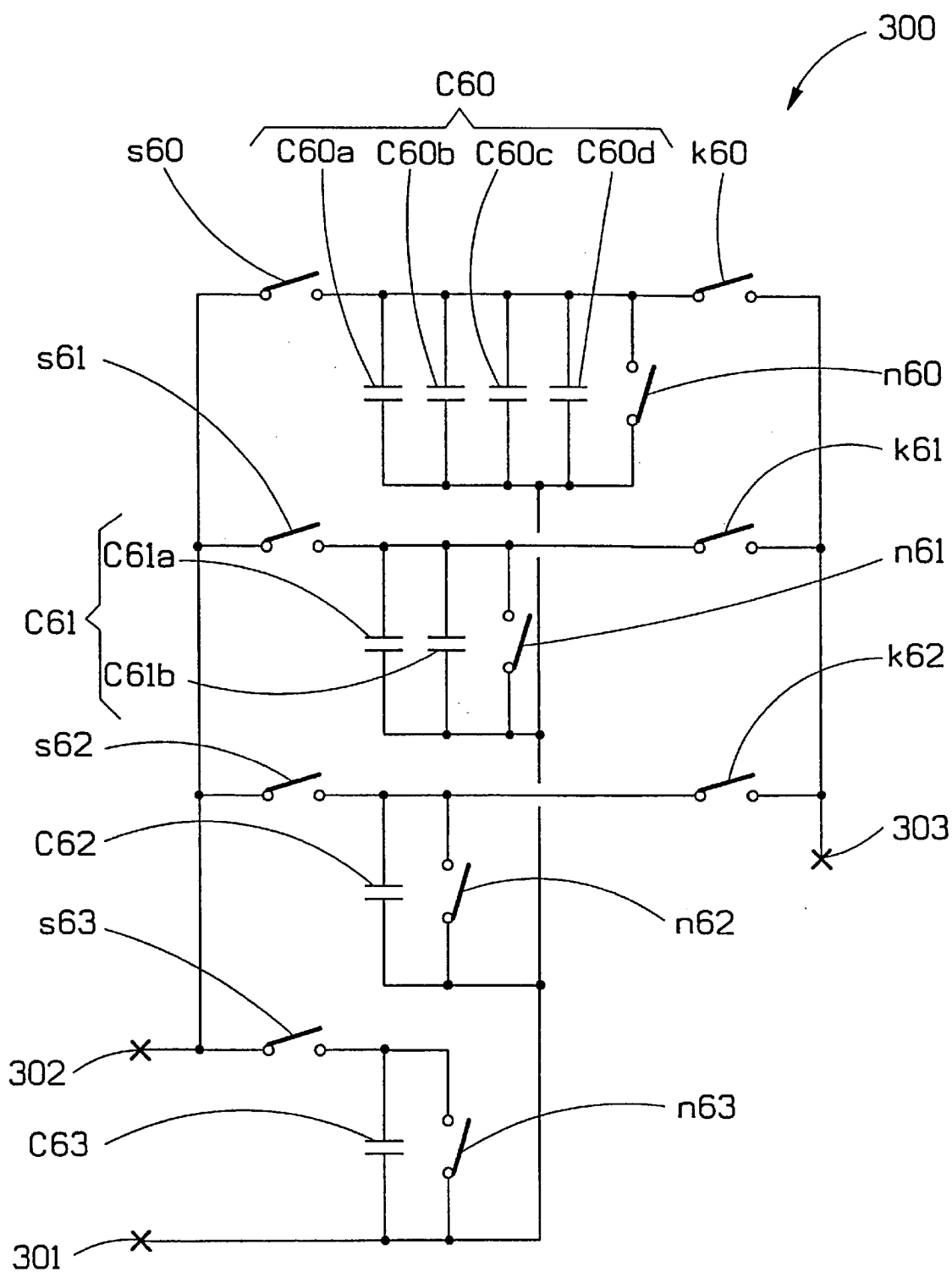
FIG. 3 shows a least significant bit or bits expansion.

FIG. 3 shows a least significant bit or bits expansion (LSB-expansion) 300. The LSB-expansion is meant to replace the last sequentally controlled charge sharing capacitor and associated switches of a variable switched capacitor circuit. To facilitate the understanding of the LSB-expansion 300 the replacement is done in relation to FIG. 1. The LSB-expansion 300 is not restricted to be used with a switched capacitor circuit according to FIG. 1. The LSB-expansion replaces the last capacitor and associated switches, in this case capacitor C6 and switches s6 and n1 of FIG. 1. The connection points 301, 302, 303 of the LSB-expansion 300 of FIG. 3 are connected to the respective connection points 101, 102,103 of FIG. 1.

The LSB-expansion 300 of FIG. 3 demonstrates an expansion of three least significant bits. The LSB-expansion 300 comprises four capacitors C60 (comprising four part-capacitors C60a, C60b, C60c, C60d in the figure), C61 (comprising two part-capacitors C61a, C61b in the figure), C62, and C63. Each capacitor C60, C61, C62, C63 has its own corresponding discharge switch n60, n61, n62, n63, and its own corresponding signal switch s60, s61, s62, s63. All the capacitors except the last capacitor C63 has its own corresponding part-coefficient switch k60, k61, k62. As previously discussed, according to preferred emodiments of the invention, all, or most, of the capacitors should preferably have the same value. In normalized values and with linear binary coefficients, C6 of FIG. 1, which the LSB-expansion is replacing, should be 1 unit. This means that the capacitors C60, C61, C62, C63 of the LSB-expansion 300 should make up the same value as C6 of FIG. 1 and at the same time keep the mutual relationship of C60 having twice the capacitance of C61, which in turn should have twice the capacitance of C62, which in turn should have the same capacitance as C63. The smallest capacitor in this example will then be one eighth of a unit. Suitably, to keep as accurate a mutual relationship as possible, at least the LSB-expansion is made with the same size capacitors, in this example 0.125 unit capacitors or a division thereof. This means that C60 is suitably made with four 0.125 unit capacitors C60$a$, C60$b$, C60$c$, C60$d$, and C61 is made with two 0.125 unit capacitors C61$a$, C61$b$. C62 and C63 are made with one 0.125 unit capacitor each. As is explained previously, the capacitance relationship between the capacitors can be different if another coefficient type is desired, such as logarithmic. The rest of the switched capacitor circuit, the capacitors of FIG. 1, can advantageously either be made up of capacitors of 0.125 units each, thus needing eight for each capacitor of FIG. 1, or as previously mentioned of 1 unit each.

The part-coefficients that an LSB-expansion will give, will depend on what capacitor the LSB-expansion replaces, i.e. what charge that capacitor would have had and thus what part-coefficient value it represented. The LSB-expansion of FIG. 3 according to the example with FIG. 1 gives, assuming linear binary part-coefficients, a part-coefficient value of 1/64 for part-coefficient switch k60 for capacitor C60, a part-coefficient value of 1/128 for part-coefficient switch k61 for capacitor C61, and a part-coefficient value of 1/256 for part-coefficient switch k62 for capacitor C62.

Looking only at the operation of the LSB-expansion 300, during a first time period the capacitors C60, C61, C62, C63 are discharged via their corresponding discharge switches n60, n61, n62, n63. The signal switch s5 of FIG. 1 and discharge switches n60, n61, n62, n63 are thus switched from open to closed at the beginning of the first time period, kept closed during the first time period and then opened again at the end of the first time period. During a second time period of this LSB-expansion 300, the four capacitors C60, C61, C62, C63 are connected to capacitor C5 of FIG. 1 for charge sharing via their corresponding signal switches s60, s61, s62, s63. The signal switches s60, s61, s62, s63 are thus switched from open to closed at the beginning of the second time period, kept closed during the second time period and then opened again at the end of the second time period. During a third time period the part-coefficient switches k60, k61, k62 corresponding to the capacitors C60, C61, C62 can be connected to the output $V_{OUT}$ and an output circuit, in dependence on the desired weight factor by switching one or more part-coefficient switches k60, k61, k62 from open to closed at the beginning of the third time period, kept closed during the third time period and then opened again at the end of the third time period.

The control of the switches can be seen in the enhanced control table below. For the LSB-expansion 300 the fifth, sixth and seventh time periods are the most relevant time periods. The enhanced control table also include control of a most significant bit or bits expansion (MSB-expansion) which is discussed above in relation to FIG. 2. An LSB-expansion 300 can incorporate more or fewer added LSB part-coefficients.

A variable switched value capacitor circuit according to the invention can thus be made as a single chain with charge sharing, or with different combinations of for example capacitance division for MSB, which is advantageous regarding the signal to noise ration, and charge sharing for the rest, and possibly an LSB-expansion. Thus, a switched variable value capacitor circuit according to the invention can be made as a three part pipeline, where for example, the three most significant bits and the three least significant bits are scaled with capacitance division and the bits in between are scaled with charge sharing. Below is an enhanced control table which shows the control of a switched capacitor circuit comprising FIG. 1 except C1, s1, k1, C6, s6, and n6 but including the circuits of FIGS. 2 and 3. The most significant bit expansion according to FIG. 2 is coupled via contact points 210, 220, 230, 240 to corresponding contact points 110, 120, 130, 140 of FIG. 1. The least significant bit expansion according to FIG. 3 is coupled via contact points 301, 302, 303 to corresponding contact points 101, 102, 103 of FIG. 1. The resulting variable value switched capacitor circuit will have an 11 bit resolution.

A complete control table of the switches is shown below where all of the empty boxes for the switches denote that the switch in question is open, i.e. non-conducting, a "c" denotes closed, i.e. conducting, and c/o denotes that the switch is either closed or open. For the capacitors the charge Q is shown, this in contrast to the previous two tables where the capacitor voltages were shown. Q1 denotes the charge from the first sample and Q2 from the second. The charges will give the part-coefficients for the different capacitors.

| | Time Period | | | | | | | | | | |
|---|---|---|---|---|---|---|---|---|---|---|---|
| | 1 | 2 | 3 | 4 | 5 | 6 | 7 | 8 | 9 | 10 | 11 |
| Reset switch | | | | | | | | | | | |
| n2 | c | | | | c | | | | | | |
| n3 | | c | | | | c | | | | | | |
| n4 | | | c | | | | c | | | | |
| n5 | | | | c | | | | c | | | |
| n60 | | | | | c | | | | | c | |
| n61 | | | | | c | | | | | c | |
| n62 | | | | | c | | | | | c | |
| n63 | | | | | c | | | | | c | |

-continued

| | Time Period | | | | | | | | | | |
|---|---|---|---|---|---|---|---|---|---|---|---|
| | 1 | 2 | 3 | 4 | 5 | 6 | 7 | 8 | 9 | 10 | 11 |

Signal switch

| | | | | | | | | | | | |
|---|---|---|---|---|---|---|---|---|---|---|---|
| s10 | c | | | | c | | | | | | |
| s11 | c | | | | c | | | | | | |
| s12 | c | | | | c | | | | | | |
| s13 | c | | | | c | | | | | | |
| s2 | | c | | | | c | | | | | |
| s3 | | | c | | | | c | | | | |
| s4 | | | | c | | | | c | | | |
| s5 | | | | | c | | | | c | | |
| s60 | | | | | | c | | | | c | |
| s61 | | | | | | c | | | | c | |
| s62 | | | | | | c | | | | c | |
| s63 | | | | | | c | | | | c | |

Part-Coefficient switch

| | | | | | | | | | | | |
|---|---|---|---|---|---|---|---|---|---|---|---|
| k10 | | c/o | | | | c/o | | | | | |
| k11 | | c/o | | | | c/o | | | | | |
| k12 | | c/o | | | | c/o | | | | | |
| k13 | | | c/o | | | | c/o | | | | |
| k2 | | | c/o | | | | | c/o | | | |
| k3 | | | | c/o | | | | | c/o | | |
| k4 | | | | | c/o | | | | | c/o | |
| k5 | | | | | | c/o | | | | | c/o |
| k60 | | | | | | c/o | | | | | c/o |
| k61 | | | | | | c/o | | | | | c/o |
| k62 | | | | | | c/o | | | | | c/o |

Capacitor charge

| | 1 | 2 | 3 | 4 | 5 | 6 | 7 | 8 | 9 | 10 | 11 |
|---|---|---|---|---|---|---|---|---|---|---|---|
| 4*C10x | $4Q_1$ | $4Q_1$ | | | | $4Q_2$ | $4Q_2$ | | | | |
| 2*C11x | $2Q_1$ | $2Q_1$ | | | | $2Q_2$ | $2Q_2$ | | | | |
| C12 | $Q_1$ | $Q_1$ | | | | $Q_2$ | $Q_2$ | | | | |
| C13 | $Q_1$ | $Q_1/2$ | $Q_1/2$ | | | $Q_2$ | $Q_2/2$ | $Q_2/2$ | | | |
| C2 | 0 | $Q_1/2$ | $Q_1/4$ | $Q_1/4$ | 0 | $Q_2/2$ | $Q_2/4$ | $Q_2/4$ | | | |
| C3 | | 0 | $Q_1/4$ | $Q_1/8$ | $Q_1/8$ | 0 | $Q_2/4$ | $Q_2/8$ | $Q_2/8$ | | |
| C4 | | | 0 | $Q_1/8$ | $Q_1/16$ | $Q_1/16$ | 0 | $Q_2/8$ | $Q_2/16$ | $Q_2/16$ | |
| C5 | | | | 0 | $Q_1/16$ | $C_1/32$ | $C_1/32$ | 0 | $Q_2/16$ | $Q_2/32$ | $Q_2/32$ |
| 4*C60x | | | | | 0 | $Q_1/64$ | $Q_1/64$ | 0 | | $Q_2/64$ | $Q_2/64$ |
| 2*C61x | | | | | 0 | $Q_1/128$ | $Q_1/128$ | 0 | | $Q_2/128$ | $Q_2/128$ |
| C62 | | | | | 0 | $Q_1/256$ | $Q_1/256$ | 0 | | $Q_2/256$ | $Q_2/256$ |
| C63 | | | | | 0 | $Q_1/256$ | | 0 | | $Q_2/256$ | |

The described basic embodiments of the invention have only been for positive coefficients/weight factors. Only the embodiments which do not use any interleaving/overlap/pipelining can use inversion of the input terminals to the output circuit, as both positive and negative coefficients can appear simultaneously. One possible solution for the other embodiments that use interleaving can be time multiplexing between positive and negative coefficients, which can sometimes be considered to be time consuming. Another possibility is to split the output circuit, most commonly an integrator, into two circuits, one for negative values and one for positive values which are thereafter put together. A third solution is to build the whole circuit completely differential, then the sign of the coefficient can be decided at sampling by inverting the input signal and the sign is then automatically propagated through the pipeline so that all the bits of the coefficient gets the correct sign. This solution is advantageous also from an electrical interference point of view (common mode rejection).

FIG. 1
100 switched capacitor circuit
101 connection point for LSB enhancement of for example FIG. 3, connection point 301
102 connection point for LSB enhancement of for example FIG. 3, connection point 302
103 connection point for LSB enhancement of for example FIG. 3, connection point 303
110 connection point for MSB enhancement of for example FIG. 2, connection point 210
120 connection point for MSB enhancement of for example FIG. 2, connection point 220
130 connection point for MSB enhancement of for example FIG. 2, connection point 230
140 connection point for MSB enhancement of for example FIG. 2, connection point 240
199 optional output circuit, integrator
OP operational amplifier
$C_i$ integrator capacitor
$n_i$ integrator capacitor $C_i$ nullification/discharge switch
n2 nullification/discharge switch for capacitor C2
n3 nullification/discharge switch for capacitor C3
n4 nullification/discharge switch for capacitor C4
n5 nullification/discharge switch for capacitor C5
n6 nullification/discharge switch for capacitor C6
s1 charge switch for capacitor C1
s2 charge switch for capacitor C2
s3 charge switch for capacitor C3
s4 charge switch for capacitor C4
s5 charge switch for capacitor C5
s6 charge switch for capacitor C6
k1 part-coefficient switch for capacitor C1
k2 part-coefficient switch for capacitor C2
k3 part-coefficient switch for capacitor C3 k4 part-coefficient switch for capacitor C4
k5 part-coefficient switch for capacitor C5
C1 capacitor
C2 capacitor
C3 capacitor
C4 capacitor
C5 capacitor
C6 capacitor
FIG. 2
200 most significant bits expansion with parallel operated capacitors
210 connection point to for example switched capacitor circuit of FIG. 1, connection point 110
220 connection point to for example switched capacitor circuit of FIG. 1, connection point 120
230 connection point to for example switched capacitor circuit of FIG. 1, connection point 130
240 connection point to for example switched capacitor circuit of FIG. 1, connection point 140
s10 charge switch for capacitor C10
s11 charge switch for capacitor C11
s12 charge switch for capacitor C12
s13 charge switch for capacitor C13
k10 part-coefficient switch for capacitor CdO
k11 part-coefficient switch for capacitor C11
k12 part-coefficient switch for capacitor C12
k13 part-coefficient switch for capacitor C13
C10 capacitor
C10a part-capacitor for making C10
C10b part-capacitor for making C10
C10c part-capacitor for making C10
C10d part-capacitor for making C10
C11 capacitor
C11a part-capacitor for making C11
C11b part-capacitor for making C11
C12 capacitor
C13 capacitor
FIG. 3
300 least significant bits expansion with parallel operated capacitors
301 connection point to for example switched capacitor circuit of FIG. 1, connection point 101
302 connection point to for example switched capacitor circuit of FIG. 1, connection point 102
303 connection point to for example switched capacitor circuit of FIG. 1, connection point 103
n60 nullification/discharge switch for capacitor C60
n61 nullification/discharge switch for capacitor C61
n62 nullification/discharge switch for capacitor C62
n63 nullification/discharge switch for capacitor C63
s60 charge switch for capacitor C60
s61 charge switch for capacitor C61
s62 charge switch for capacitor C62
s63 charge switch for capacitor C63
k60 part-coefficient switch for capacitor C60
k61 part-coefficient switch for capacitor C61
k62 part-coefficient switch for capacitor C62
C60 capacitor
C60a part-capacitor for making C60
C60b part-capacitor for making C60
C60c part-capacitor for making C60
C60d part-capacitor for making C60
C61 capacitor
C61a part-capacitor for making C61
C61b part-capacitor for making C61
C62 capacitor
C63 capacitor

What is claimed is:

1. A switched-capacitor circuit comprising:
   a plurality of sequentially operated switched-capacitors arranged in a chain which are sequentially switched during a plurality of time periods, the sequentially-operated switched capacitors include:
   a first switched-capacitor arranged to be coupled and thereafter uncoupled to an input signal during a first time period thereby charging the first switched-capacitor to an input value in dependence on the input signal;
   a second switched-capacitor arranged to be coupled and thereafter uncoupled to the first switched-capacitor during a second time period for charge distribution between the second and the first switched capacitor thereby dividing the charge between the first and the second switched-capacitor; and
   a final switched-capacitor arranged to be coupled and thereafter uncoupled to a preceding switched-capacitor in the chain during a final time period for charge distribution between the final and the preceding switched-capacitor thereby dividing the charge between the final and the preceding switched-capacitor; and
   means for selectively coupling the first and the second switched-capacitors to an output circuit thereby enabling a desired weight factor of the input signal to be attained.

2. The switched-capacitor circuit according to claim 1, further comprising a predetermined number of additional sequentially operated switched-capacitors arranged in a chain between the second switched capacitor and the final switched-capacitor, wherein each additional sequentially operated switched-capacitor is arranged to be coupled and thereafter uncoupled to a preceding capacitor in the chain during a time period for charge distribution between the additional switched-capacitor and the preceding switched-capacitor thereby dividing the charge between the additional switched-capacitor and the preceding switched capacitor.

3. The switched-capacitor circuit according to claim 1, wherein the circuit further comprises a first parallel-operated switched-capacitor which is arranged to be coupled and thereafter be uncoupled to the input signal during the first time period.

4. The switched-capacitor circuit according to claim 1, wherein each of a plurality of means for selectively coupling a corresponding one of a plurality of sequentially-operated capacitors to an output circuit is selectively activated during a time period which is after a time period when the capacitor distributed its charge to another one of the plurality of capacitors.

5. The switched-capacitor circuit according to claim 1, wherein each a plurality of switched-capacitors which are not coupled directly to the input signal are shorted at the latest during a time period before a time period in which one of the plurality of switched-capacitors receives a charge distribution from another one of the plurality of switched-capacitors.

6. The switched-capacitor circuit according to claim 1, wherein the circuit is doubled into two identical branches, and operation of the branches is time shifted in relation to each other, thereby doubling the throughput rate.

7. The switched-capacitor circuit according to claim 1, wherein the circuit is quadrupled into four identical branches, and operation of the branches is time shifted in relation to each other, thereby quadrupling the throughput rate.

8. The switched-capacitor circuit according to claim 7, wherein the circuit is arranged to be coupled to one output for every four sequentially-operated switched-capacitors that can be selectively coupled to an output circuit.

9. The switched-capacitor circuit according to claim 1, wherein the switched-capacitors all have the same capacitance thereby enabling a selectable linear binary weighting of the input signal.

10. The switched-capacitor circuit according to claim 1, further comprising more input capacitors whose capacitances are different multiples of the sequentially-operated switched capacitors' capacitances.

11. The switched-capacitor circuit according to claim 1, further comprising more parallel-operated least significant bit switched-capacitors.

12. The switched-capacitor circuit according to claim 1, wherein the final switched-capacitor includes a plurality of parallel operated least significant bit switched-capacitors.

13. The switched-capacitor circuit according to claim 1, further comprising output means including an integrator thereby providing a computing-element for weighted summations.

14. The switched-capacitor circuit according to claim 13, wherein the circuit is a filter which filters the input signal.

15. The switched-capacitor circuit according to claim 13, wherein the circuit is a finite impulse response filter working according to a series development.

16. The switched-capacitor circuit according to claim 1, wherein the circuit comprises two output circuits, one output giving a quadrature value and the other output giving an in-phase value.

17. The switched-capacitor circuit according to claim 1, wherein the circuit is completely differential to thereby handle both positive and negative weight factors.

18. The switched-capacitor circuit according to claim 1, wherein the circuit comprises a reversing switch to reverse a polarity of the input signal to thereby enable both positive and negative weight factors.

19. A switched-capacitor circuit, comprising:
a plurality of sequentially-operated switched-capacitors, the first of which is coupled to an input signal during a first time period thereby charging the first switched capacitor to an input value in dependence on the input signal, thereafter the charge on the first switched capacitor is sequentially charge distributed during further time periods, where each sequential charge distribution is between pairs of sequentially-operated switched-capacitors by first dividing the charge between a first pair of sequentially-operated switched capacitors consisting of the first sequentially-operated switched-capacitor and a second sequentially-operated switched-capacitor and then during a next time period dividing the charge between a second pair of sequentially-operated switched capacitors consisting of the second sequentially-operated switched-capacitor and a third sequentially-operated switched-capacitor and so on between pairs of sequentially-operated switched-capacitors until a last sequentially operated switched-capacitor belongs to a pair of switched-capacitors performing charge division; and means for selectively coupling the switched-capacitors to an output circuit thereby enabling a desired weight factor of the input signal to be attained.

20. A switched-capacitor circuit comprising a plurality of sequentially-operated switched-capacitors, the plurality of sequentially-operated switched capacitors include:
an input switched-capacitor arranged to be coupled and thereafter uncoupled to an input signal during a first time period thereby charging the input switched-capacitor to an input value in dependence on the input signal;

a predetermined number of switched-capacitors of which one of the predetermined number of switched-capacitors is arranged to be coupled and thereafter uncoupled to another one of the predetermined number of switched capacitors, during a time period for charge distribution between the one and the other of the predetermined number of switched capacitor thereby dividing a charge between them, the other one of the predetermined number of switched-capacitors having been charged during the preceding time period, wherein during successive time periods each of the predetermined number of switched-capacitors are arranged to be coupled and thereafter uncoupled to another one of the predetermined number of switched-capacitors, the other one of the predetermined number of switched-capacitors having been charged during the preceding time period;

a final switched-capacitor arranged to be coupled and thereafter uncoupled to the one of the predetermined number of switched-capacitors that was charged during the previous time period thereby dividing the charge between the final and the one of the predetermined number of switched-capacitors;

whereby by further coupling by coupling means selected switched-capacitors to an output circuit a desired weight factor of the input signal can be attained.

21. A method of weighting an input signal by means of a switched-capacitor circuit comprising a plurality of switched-capacitors arranged in a chain, by sequential switching of the switched capacitors during a plurality of time periods, wherein the method comprises the following steps:
charging a first switched-capacitor to an input value in dependence on the input signal by coupling and thereafter uncoupling the first switched capacitor to an input signal during a first time period;

dividing the charge on the first switched-capacitor between the first switched-capacitor and a second switched-capacitor by coupling and thereafter uncoupling the second switched-capacitor to the first switched-capacitor during a second time period for enabling charge distribution between the second and the firs switched-capacitor;

dividing the charge on a preceding switched-capacitor between the preceding switched-capacitor and a final switched-capacitor by coupling and thereafter uncoupling the final switched capacitor to the preceding switched-capacitor during a final time period for enabling charge distribution between the final and the preceding switched-capacitor;

selectively coupling the first switched-capacitor to an output circuit;

selectively coupling the second switched-capacitor to the output circuit;

thereby enabling a desired weight factor of the input signal to be attained.

22. The method according to claim 21, wherein the method further comprises a predetermined number of additional steps preferably performed between the second time period and the final time period performed on one or more additional switched-capacitors, where the additional steps are performed repeatedly by:

dividing the charge on the switched-capacitor that was charged during a preceding time period between the switched-capacitor that was charged during the preceeding time period and an additional switched-capacitor by coupling and thereafter uncoupling the additional switched capacitor to the switched-capacitor hat was charged during the preceding time period during a time period for charge distribution between the additional switched-capacitor and the switched-capacitor that was charged during the preceding time period;

selectively coupling each additional switched-capacitor to the output circuit.

23. The method according to claim 21, wherein each step of selectively coupling a switched-capacitor to an output circuit is for each capacitor selectively activated during a time period which is after a time period when the switched-capacitor distributed its charge to another capacitor.

24. The method according to claim 21, wherein the method further comprises the step of coupling and thereafter uncoupling a first parallel-operated switched-capacitor to the input signal during the first time period, and selectively coupling the first parallel-operated switched-capacitor to an output circuit.

25. The method according to claim 21, wherein for each switched-capacitor which is not coupled directly to the input signal the method comprises the step of shorting a switched-capacitor at the latest during a time period before a time period in which the switched capacitor receives a charge distribution from a preceding switched capacitor.

* * * * *